(12) United States Patent
Battiston et al.

(10) Patent No.: US 11,523,548 B2
(45) Date of Patent: Dec. 6, 2022

(54) FLOW-COOLED TOROIDAL OR CIRCULAR POWER ELECTRONICS

(71) Applicant: IFP Energies nouvelles, Rueil-Malmaison (FR)

(72) Inventors: Alexandre Battiston, Rueil-Malmaison (FR); Laid Kefsi, Garches (FR); Fabrice Le Berr, Rueil-Malmaison (FR)

(73) Assignee: IFP ENERGIES NOUVELLES, Rueil-Malmaison (FR)

( * ) Notice: Subject to any disclaimer, the term of this patent is extended or adjusted under 35 U.S.C. 154(b) by 290 days.

(21) Appl. No.: 16/955,249

(22) PCT Filed: Nov. 28, 2018

(86) PCT No.: PCT/EP2018/082883
§ 371 (c)(1),
(2) Date: Jun. 18, 2020

(87) PCT Pub. No.: WO2019/120914
PCT Pub. Date: Jun. 27, 2019

(65) Prior Publication Data
US 2020/0329591 A1 Oct. 15, 2020

(30) Foreign Application Priority Data
Dec. 18, 2017 (FR) .................................. 17/62.370

(51) Int. Cl.
*H05K 7/20* (2006.01)
*F02B 33/40* (2006.01)
*H05K 1/02* (2006.01)

(52) U.S. Cl.
CPC ......... *H05K 7/20927* (2013.01); *F02B 33/40* (2013.01); *H05K 1/0203* (2013.01);
(Continued)

(58) Field of Classification Search
CPC .......... H02K 11/33; H02K 5/00; H02K 5/207; H02K 9/02; H05K 1/0203; H05K 1/144;
(Continued)

(56) References Cited

U.S. PATENT DOCUMENTS 2,752,537 A * 6/1956 Wolfe ..................... H05K 1/144
361/728
3,141,999 A * 7/1964 Schneider .......... H05K 7/20254
361/752
(Continued)

FOREIGN PATENT DOCUMENTS

EP 3177115 A1 6/2017
JP 6460244 A 3/1989
(Continued)

OTHER PUBLICATIONS

International Search Report for PCT/EP2018/082883, dated Feb. 18, 2019; English translation submitted herewith (7 pgs.).
(Continued)

*Primary Examiner* — Mandeep S Buttar
(74) *Attorney, Agent, or Firm* — Fitch, Even, Tabin & Flannery LLP

(57) ABSTRACT

The invention is a power electronic system comprising at least one power electronic component implemented at least partly on at least one circuit board. The circuit boards are planar and circular or toroidal in shape with the center thereof comprising a circular opening having a diameter D cooperating with a hose for circulating a flow.

20 Claims, 4 Drawing Sheets

(52) U.S. Cl.
CPC ......... *H05K 7/209* (2013.01); *H05K 7/20172* (2013.01); *H05K 7/20327* (2013.01); *H05K 7/20909* (2013.01)

(58) Field of Classification Search
CPC .. H05K 7/1434; H05K 7/209; H05K 7/20927; H05K 3/368; H05K 7/20909
USPC ........ 361/688; 165/80.4, 80.3; 310/58, 68 R; 257/714
See application file for complete search history.

(56) References Cited

U.S. PATENT DOCUMENTS

| | | | | |
|---|---|---|---|---|
| 4,888,663 | A | * | 12/1989 | Longerich .......... H05K 7/20236 361/689 |
| 5,102,040 | A | * | 4/1992 | Harvey ................ F24F 11/0001 361/679.48 |
| 5,235,491 | A | | 8/1993 | Weiss |
| 5,491,370 | A | | 2/1996 | Schneider et al. |
| 6,161,910 | A | * | 12/2000 | Reisenauer ............. B60Q 3/44 362/800 |
| 6,199,625 | B1 | * | 3/2001 | Guerrero ............ H01L 23/3672 165/185 |
| 6,930,417 | B2 | | 8/2005 | Kaneko et al. |
| 2002/0170905 | A1 | | 11/2002 | Peterson et al. |
| 2005/0061478 | A1 | * | 3/2005 | Huang .................. H01L 23/467 257/E23.099 |
| 2011/0083830 | A1 | * | 4/2011 | Xu ...................... F28D 15/0233 165/185 |
| 2016/0065038 | A1 | * | 3/2016 | Lee ........................ H02K 11/33 180/65.265 |
| 2017/0113225 | A1 | * | 4/2017 | Howell ................ G01N 21/272 |
| 2017/0164508 | A1 | | 6/2017 | Tramet et al. |

FOREIGN PATENT DOCUMENTS

| | | |
|---|---|---|
| JP | 10257718 A | 9/1998 |
| JP | 2005086947 A | 3/2005 |
| JP | 2009162091 A | 7/2009 |
| JP | 2014042414 A | 3/2014 |
| JP | 2015171252 A | 9/2015 |
| JP | 2016523509 A | 8/2016 |
| WO | 2014207638 A2 | 12/2014 |
| WO | 2015/170036 A1 | 11/2015 |
| WO | 2016/012666 A1 | 1/2016 |

OTHER PUBLICATIONS

JP Office Action dated Jun. 21, 2022, JP Patent Application No. 2021-552110.

* cited by examiner

FLOW-COOLED TOROIDAL OR CIRCULAR POWER ELECTRONICS

CROSS-REFERENCE TO RELATED APPLICATIONS

Reference is made to International Application No. PCT/EP2018/082883, filed Nov. 28, 2018, which claims priority to French Patent Application No. 17/62.370, filed Dec. 18, 2017, the contents of which are incorporated herein by reference in their entirety.

BACKGROUND OF THE INVENTION

Field of the Invention

The present invention relates to the field of power electronic systems, in particular for controlling electric machines such as, in particular, supercharger systems used for example for internal combustion engines. More specifically, the invention relates to a power electronic system that is configured to be cooled by a cooling device.

Description of the Prior Art

Certain power electronic systems may be DC-to-AC power electronic converters, in particular inverters, which interface DC voltage sources with AC electric machines. These inverters perform functions that are essential for electrical conversion and shape electrical quantities (currents, voltages and frequency) from DC voltage sources. Thus, the functions performed by these inverters are in particular interfacing a voltage source with a load or a source of another nature, controlling the voltages and currents in play, providing good quality of power, whether source-side or load-side, and ensuring the electrical stability of the overall conversion system.

Generally speaking, since power electronic systems comprise power electronic components, heat is generated. The heat generated may bring the power components to temperatures that are such that the performance of the power components may be negatively affected, and their structures may even be damaged. This is especially so in thermally restrictive environments, such as is the case for an internal combustion engine.

To overcome these temperature-rise problems, various solutions have been developed. U.S. Pat. No. 6,930,417 describes an inverter combined with an electric motor in which the power components of the inverter are mounted directly on the electric motor. In this scenario, the power components of the inverter are cooled by a water or liquid cooling circuit.

U.S. published patent application Ser. No. 00/5491,370 describes incorporating power electronics as close as possible to an electric machine. The power components are arranged on the edge of the frame of the electric machine. This structure similarly uses a water cooling circuit.

Finally, other solutions propose using a fan to cool the power electronic components.

The prior art has drawbacks such as, in particular, the need for cooling systems that are difficult to design and to incorporate, such as water cooling circuits or fans, or such as the need to use power components which withstand high temperatures well when they are arranged in proximity to an internal combustion engine. This entails extra cost for the power electronic systems.

SUMMARY OF THE INVENTION

The present invention is directed to overcoming the drawbacks presented above and to provide cooling of power electronic systems which is simple in design and is effective while incorporating the electronic components as close as possible to the electric machine to be driven to limit the costs in the design and use of materials for wiring between the components and the machine and the costs in the power components.

Thus, to achieve at least the objectives given above, among others, the present invention provides, according to a first aspect, a power electronic system comprising one or more power electronic components implemented at least partly on one or more circuit boards. The circuit board is planar and circular or toroidal in shape, the center of which comprises a circular opening of diameter D for cooperating with a hose for circulating a flow.

The effect of such a configuration permits the use of the flow from a hose to cool power electronic components. The components, are placed on the boards, and benefit from the removal of heat by the flow. In addition, it is possible to use an existing hose system and simply to adapt the power electronic system to a device comprising a hose that is already present without modifying the system that is already present, making it possible to have a power electronic system that is compact and straightforward to implement.

According to the invention, the circuit board is positioned substantially orthogonally to the hose for circulating the flow and substantially in the same axis as the hose such that the flow circulates through the circular opening in the circuit board.

The effect is to maximize the flow through the opening, to remove as much heat as possible.

According to the invention, the hose for circulating the flow is an air intake hose for an internal combustion engine. In this way, it is possible to use the intake air in an engine to have it flow through the center of the electronic device. Since this air is at ambient temperature, it allows heat from a hotter heat source to be removed.

According to the invention, the diameter D1 of the hose is substantially larger than or equal to the diameter D of the circular opening in the circuit board. In this way, all of the flow through the hose will be used to remove heat.

According to the invention, the power electronic system comprises a mechanical housing in which the circuit board is mounted. Such a housing allows the boards to be held together and also protects them from external stresses.

According to the invention, the mechanical housing is circular or toroidal in shape and comprises a circular opening of diameter D2 that is substantially equivalent to or larger than the diameter D of the circular opening in the circuit board. The effect is to make it possible for the flow through the device not to be hindered by the edges of the housing and to be able to flow fully through the center of the electronic device.

According to the invention, the mechanical housing incorporates fins for capturing the heat inside the mechanical housing and transferring it to the flow from the hose. Such fins act as a radiator and allow the heat which builds up in the housing to be transferred to the flow from the hose, which allows this heat to be removed.

According to the invention, the mechanical housing incorporates a fan. The advantage of such a fan is to optimize heat transfers and hence the removal of heat by the flow which is in addition to the fins.

According to the invention, the mechanical housing comprises a system for circulating a portion of the flow from the hose inside the mechanical housing. The effect is to improve and to accelerate the transfers and removal of heat.

According to the invention, the power electronic system comprises a heat sink that is connected thermally to at least one of the circuit board and the power electronic components. The effect of such a heat sink is to increase the heat exchange area and hence to promote and to accelerate the removal of heat.

According to the invention, the heat sink is a cylinder of diameter D3 that is substantially equivalent to the diameter of the circuit board and the heat sink comprises a central opening, having a diameter which is substantially equivalent to the diameter D of the circular opening in the circuit board, and the central opening comprises an inner edge. The effect is to be able to position this heat sink in the flow from the hose in order to maximize the heat exchange area and also to minimize interference with the circulation of the flow through the hose. This heat sink is also optimized to be as close as possible to the electronic components in order to quickly collect the heat produced.

According to the invention, the heat sink comprises fins that are positioned circularly around the inner edge and the fins converge from the inner edge of the heat sink towards the center of the hose. The effect of the fins is to increase the area of heat exchange with the flow.

According to the invention, the cylinder comprises teeth. The effect of the teeth is also to increase the area of heat exchange with the flow.

According to the invention, the heat sink is a cylinder of outer diameter D4 which comprises a central opening, and which is substantially equivalent to the diameter D of the circular opening in the circuit board, and the central opening comprises an inner edge. This configuration of the heat sink allows positioning in the flow and to have an increased area of heat exchange with the flow.

According to the invention, the power electronic components are implemented at least partly on the cylinder. In this way, heat is directly transmitted to the heat sink which allows the heat to be quickly removed by the flow.

According to the invention, the heat sink comprises fins that are positioned circularly around the inner edge and the fins converge from the inner edge of the heat sink towards the center of the hose. The effect of the fins is to increase the area of heat exchange with the flow and to bring the heat as close as possible to the center, where heat removal is optimal.

According to the invention, the power electronic system supplies an electric machine with power. In this way, it is possible to have an electric machine driven by a compact system.

According to the invention, the electric machine drives a compressor.

According to the invention, the electric machine drives a turbine of a turbocharger.

According to the invention, the electric machine is positioned upstream of the compressor or of the turbine of the turbocharger.

According to the invention, the electric machine is arranged on a shaft which connects the compressor of the turbocharger to a turbine of the turbocharger.

According to a second aspect, the invention relates to a device for cooling a power electronic system such as described above and is characterized in comprising a heat sink such as described above incorporated in the axis of a hose for circulating a flow.

BRIEF DESCRIPTION OF THE DRAWINGS

Other features and advantages of the system according to the invention will become apparent upon reading the description below of non-limiting exemplary embodiments, with reference to the appended figures, which are described below.

DETAILED DESCRIPTION OF THE INVENTION

Figure 1A:
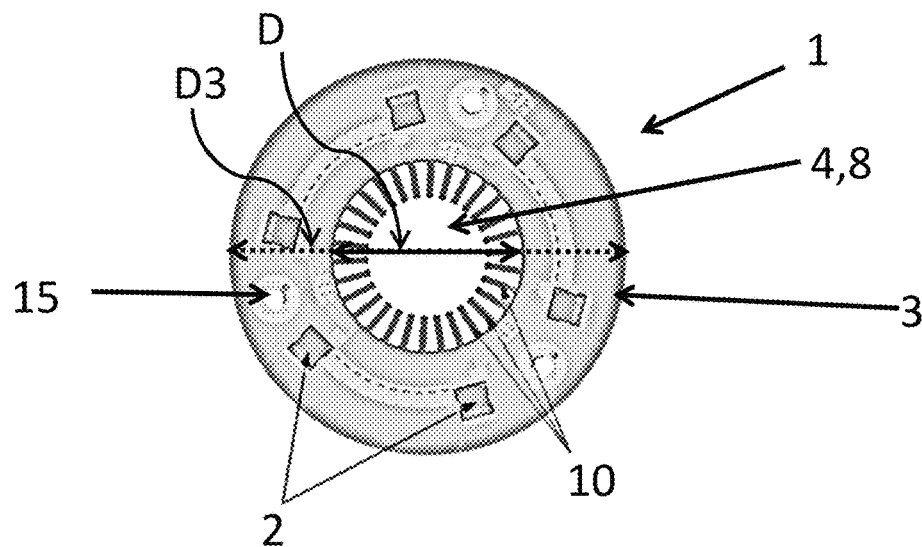
FIG. 1a is a front view of a power electronic system in a first embodiment.

The invention is power electronics (1) for powering electric machines (ME) which are located in powertrains comprising a motor or engine (M), in particular an internal combustion engine. The electric machines (ME) may be used for example for supercharging internal combustion engines and may be, without limitation, compressors (C) or turbochargers (Tc) driven by an electric machine. These power electronics (1) may comprise one or more circuit boards (3), on which electronic components are mounted. In the case that the power electronic system (1) is an inverter, serving to interface a current source with an electric machine (ME). The power electronic system (1) may comprise power electronic components (2). These power electronic components (2) are incorporated on one of the circuit boards (3). The circuit boards (3) may be incorporated within a mechanical housing (6). In the context of the invention, the power electronic components (2) are cooled by a flow which circulates through a hose (5) for circulating a flow. In the case of an internal combustion engine (M), hose (5) is an air intake hose (5) for the engine (M). The temperature of the air admitted into this hose (5) is generally close to the temperature of the ambient air (around 20° C. under nominal conditions). Additionally, the flow rate of air admitted into the hose (5) is generally proportional to the power required by the engine (M). As will be described hereinbelow, the invention relates to a cooling device which uses the flow from the hose (5) for circulating this flow to cool the electronic components.

Figure 1B:
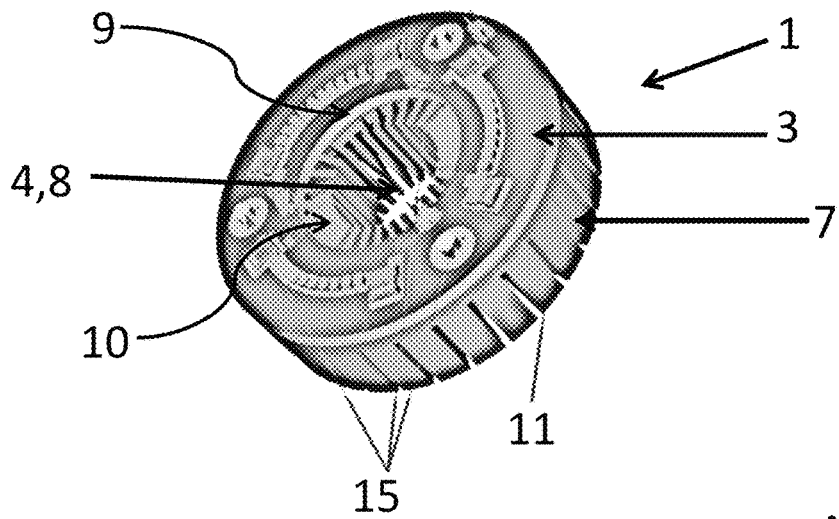
FIG. 1b is a perspective view of a power electronic system in the first embodiment.
Figure 1C:
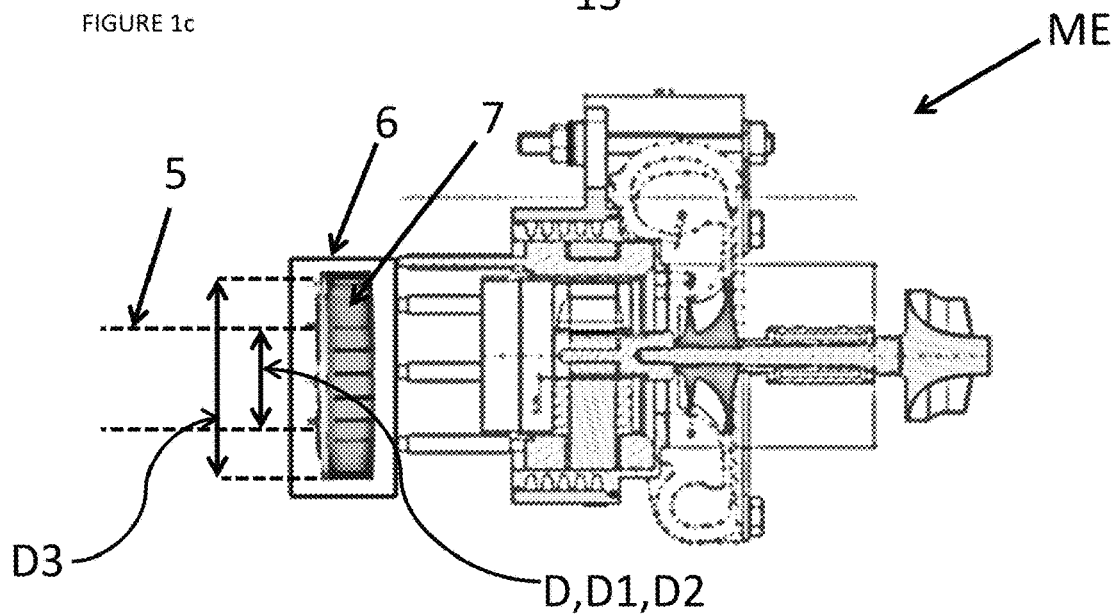
FIG. 1c is a profile view in cross section of an electric machine and of a power electronic system in the first embodiment.

In a first embodiment of the power electronic system (1) that can be seen in FIGS. 1a to 1c, the power electronic system (1) comprises one or more power electronic components (2). These power electronic components (2) are implemented on a circuit board (3) for accommodating all of the power electronic components (2) and all of the other electronic components. Without departing from the scope of the invention, there may be circuit boards (3) of which only one incorporates all of the power electronic components (2). Alternatively these components may be distributed over the installed circuit boards (3). As can be seen in FIG. 1a, the circuit boards (3) are planar, circular or toroidal in shape with the center of comprises a circular opening (4) of diameter D.

In this first embodiment as can be seen in FIG. 1c, the circuit boards (3) are positioned substantially orthogonally to the hose (5) for circulating the flow and substantially in the same axis as the hose (5) such that the flow circulates through the circular openings (4) in the circuit boards (3). Generally speaking, the hose (5) for circulating the flow is an air intake hose (5) for an internal combustion engine (M). The diameter of the hose (5) is equal to a diameter D1 and this diameter D1 is substantially larger than or equal to the diameter D of the circular openings (4) in the circuit boards (3) such that all of the flow through the hose (5) also flows through the circular openings (4) in the circuit boards (3). As mentioned above, the power electronic system (1) comprises a mechanical housing (6) in which the circuit boards (3) are mounted in the case when there and a plurality thereof. In that case, the mechanical housing (6) is circular or toroidal in shape and comprises a central opening of diameter D2. The diameter D2 of this central opening is substantially equivalent to or larger than the diameter D of the circular openings (4) in the circuit boards (3). In this way, the mechanical housing (6) allows the circuit boards (3) to be held in the flow from the hose (5) while not hindering the flow rate of the flow.

In the context of the invention and as can be seen in FIG. 1b, the power electronic system (1) will comprise a heat sink (7) in order to cool the power electronic components (2). This heat sink (7) is connected thermally to the circuit board (3). As can be seen in FIGS. 1b to 1c, the heat sink (7) is a cylinder of diameter D3. This diameter D3 of the cylinder is substantially equivalent to the diameter of the circuit boards (3) in order to have the largest possible heat exchange area. To function effectively as a heat sink, this heat sink (7) comprises a central opening (8). The diameter of this central opening (8) is substantially equivalent to the diameter D of the circular openings (4) in the circuit boards (3), with a view to allowing the flow to circulate. The length of the cylinder may be defined according to the amount of heat which is to be removed, according to the number and size of the power electronic components (2), and the central opening (8) in the length of the cylinder will define an inner edge (9) which will be as long as the cylinder. In this embodiment, the heat sink (7) comprises fins (10) which are positioned circularly around the inner edge (9). The fins (10) converge from the inner edge (9) of the heat sink (7) towards the center of the hose (5). In this way, what is obtained is a heat sink which collects the heat energy given off by the components in order to transfer it to the center of the cylinder where the flow circulates, and as close as possible to the inner diameter, directly connected to the support on which the fins are located, thereby providing effective cooling without overly disrupting the airflow and the operation of the components present downstream.

As can be seen in FIG. 1b, the cylinder may also comprise teeth (11) which are oriented in the direction of flow. They act to increase the removal of heat.

Figure 2A:
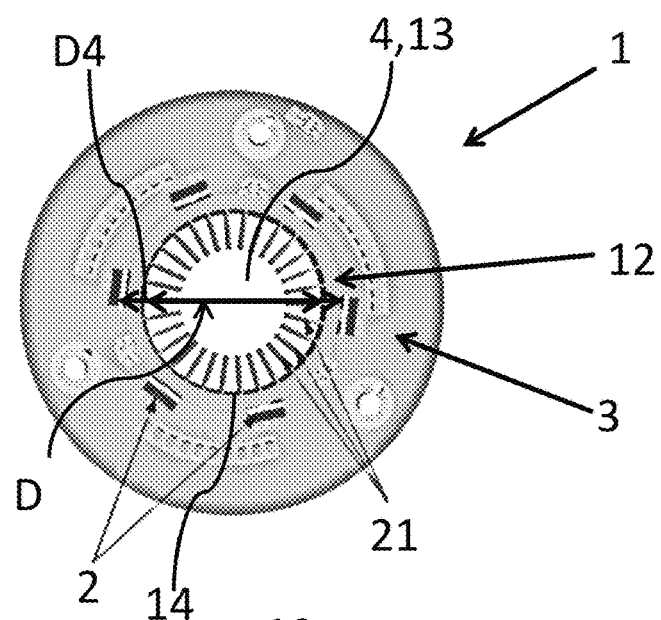
FIG. 2a is a front view of a power electronic system in a second embodiment.
Figure 2B:
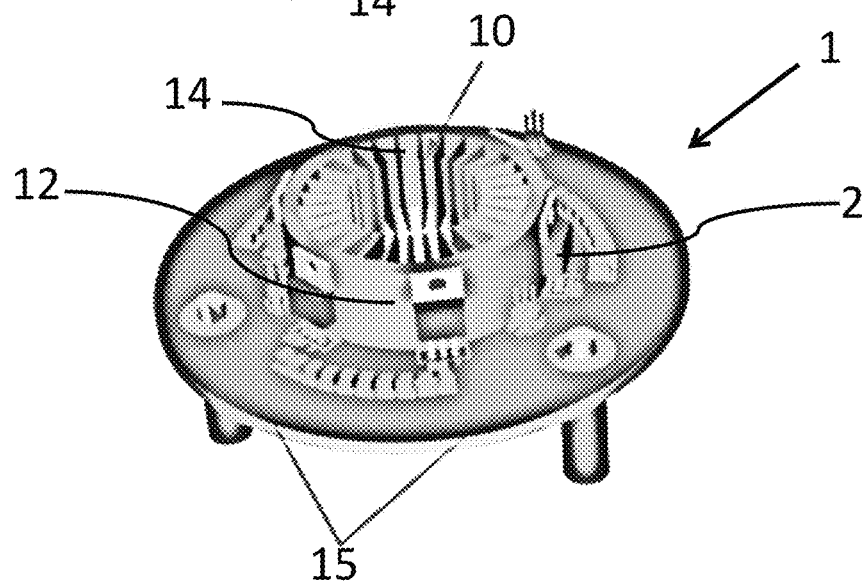
FIG. 2b is a perspective view of a power electronic system in the second embodiment.
Figure 2C:
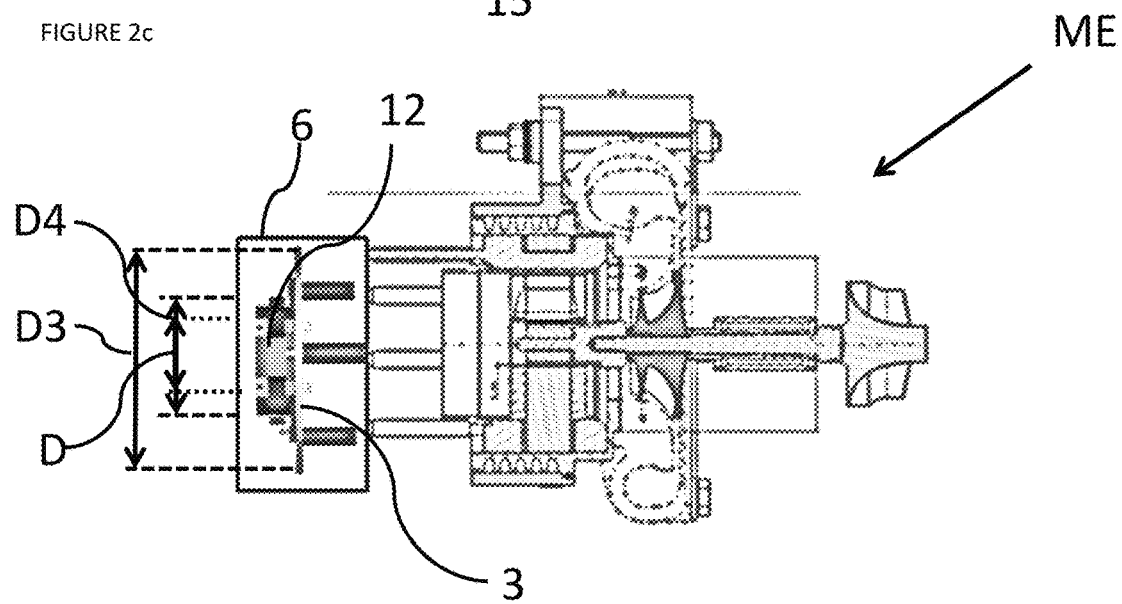
FIG. 2c is a profile view in cross section of an electric machine and of a power electronic system in the second embodiment.

In a second embodiment, which can be seen in FIGS. 2a to 2c, the heat sink (12) is a cylinder of outer D4 which comprises a central opening (13). The diameter is substantially equivalent to the diameter D of the circular openings (4) in the circuit boards (3). The central opening (13) comprises an inner edge (14). The cylinder is connected thermally to the circuit board (3) and is positioned upstream thereof, that is in the direction in which the flow circulates. However, it may also be positioned downstream of the circuit board. In this second embodiment, the power electronic components (2) are implemented at least partly on the cylinder (12). The other part is positioned on the circuit board (3). Thus, what is obtained is the power components (2) spanning the associated heat sink (7).

In this second embodiment, the heat sink (12) may also comprise fins (10). In that case, they are positioned circularly around the inner edge (14) and converge from the inner edge (14) of the heat sink (7) towards the center of the hose (5). In the same way as in the first embodiment, what is obtained is a heat sink which collects the heat energy given off by the components in order to transfer it to the center of the cylinder where the flow circulates.

In these different embodiments, these cooling devices make possible using power components (2) which are less expensive since they operate under optimal conditions. In this way, it is possible to decrease the cost of the power electronic system (1) while ensuring a satisfactory level of performance. In addition, one advantage resides in being able to omit attached cooling devices such as was mentioned previously, which are in particular either dedicated fans (which in addition limits the power consumed by the system) or devices for circulating coolant liquid, such as a water circuit. Such a cooling system additionally makes it possible to be able to incorporate the power electronic system (1) within an environment very close to the internal combustion engine (M), advantageously resulting in the length of the connections with the electric machine (ME) being decreased (and hence in EMC constraints being reduced).

This solution is particularly satisfactory for the power electronics (1) of a component powering supercharger members, since it makes it possible providing compact and integrated electric machine (ME) and inverter. Specifically, in this particular case, the power electronics (1) may be positioned as close as possible to an electric machine (ME).

In the different preceding embodiments, the mechanical housing (6) may also incorporate additional fins (not shown). They make possible collection of heat inside the mechanical housing (6) and to transfer the collected heat to circulate through the hose (5).

The mechanical housing (6) may also incorporate a fan (not shown). The purpose of this fan, unlike the dedicated fans mentioned above, is to "mix" the air inside the mechanical housing (6) and thus to promote heat exchange between the additional fins. The mechanical housing (6) may also comprise, in the different embodiments presented above, a system for circulating a portion of the flow from the hose (5) inside the mechanical housing (6). This allows flow of cooling internal air to be increased.

Figure 3:
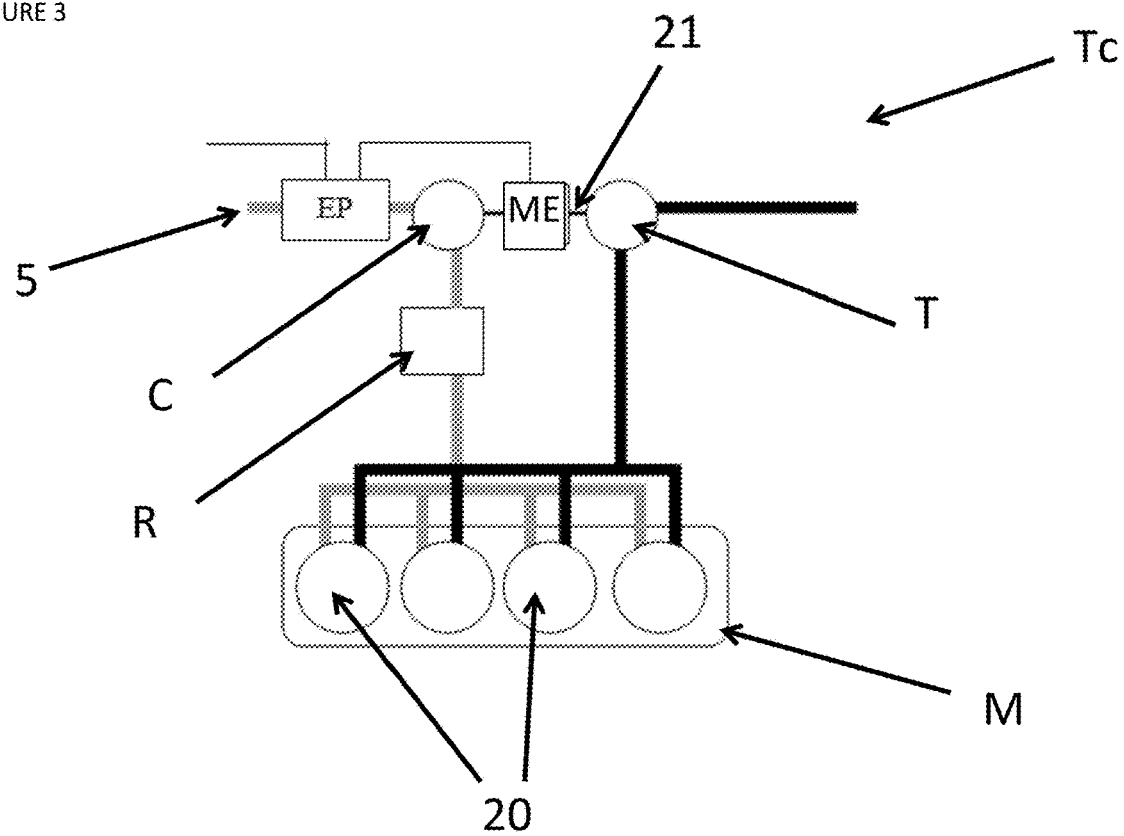
FIG. 3 illustrates a device according to a first configuration of a turbocharger driven by an electric machine.

FIG. 3 shows a turbocharger (Tc) for an internal combustion engine (M) comprising one or more pistons (20). The turbocharger (Tc) comprises a compressor (C) connected by a shaft (21) to a turbine (T), an electric machine (ME), an air intake hose (5) and a supercharger cooler (R). The power electronic system may be positioned upstream for example of the air compressor (C), where the air temperature is relatively moderate (<50° C.), allowing the length of the cables between the two members to be decreased (allowing efficiency to be increased and EMC losses to be limited, etc.). For the embodiment illustrated, the electric machine (ME) is placed on the shaft (21) which connects the compressor (C) and the turbine (T) of the turbocharger (Tc).

Figure 4:
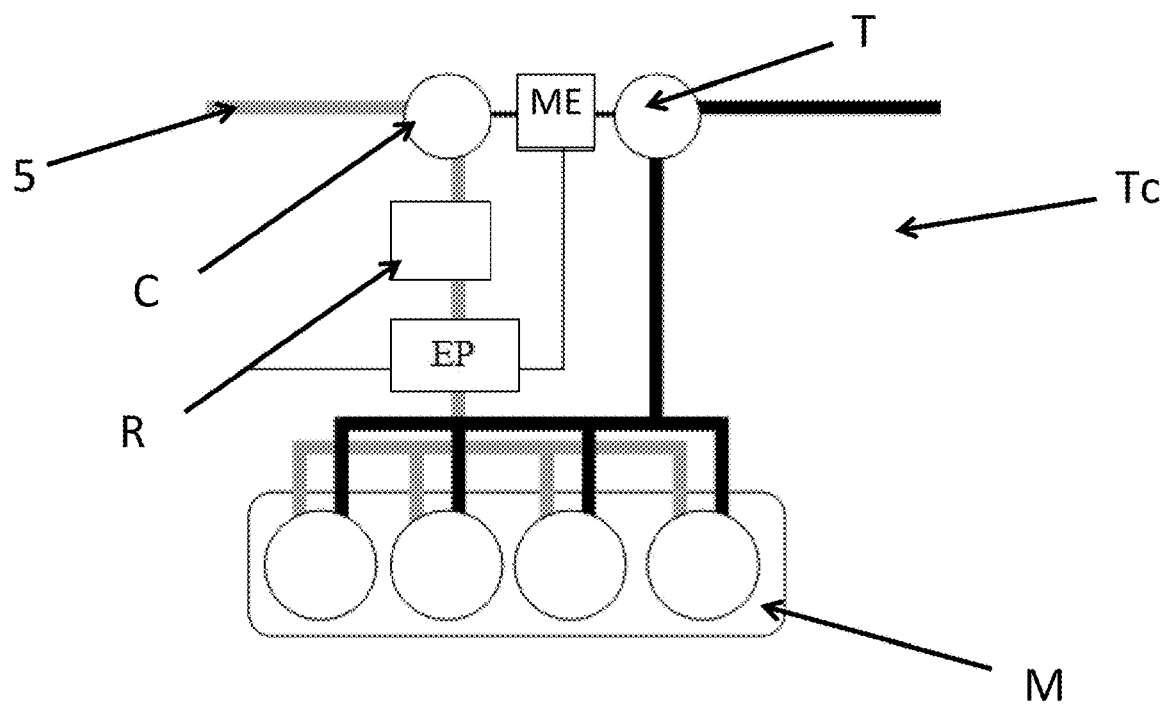
FIG. 4 illustrates a device according to a second configuration of a turbocharger driven by an electric machine.

As can be seen in FIG. 4, which shows the same turbocharger (Tc) as in FIG. 3, the power electronics may also be positioned downstream of the supercharger cooler (R) where the air temperature is controlled to be at a moderate temperature under all operating conditions. For the embodiment illustrated, the electric machine (ME) is placed on the shaft (21) which connects the compressor (C) and the turbine (T) of the turbocharger (Tc).

Figure 5:
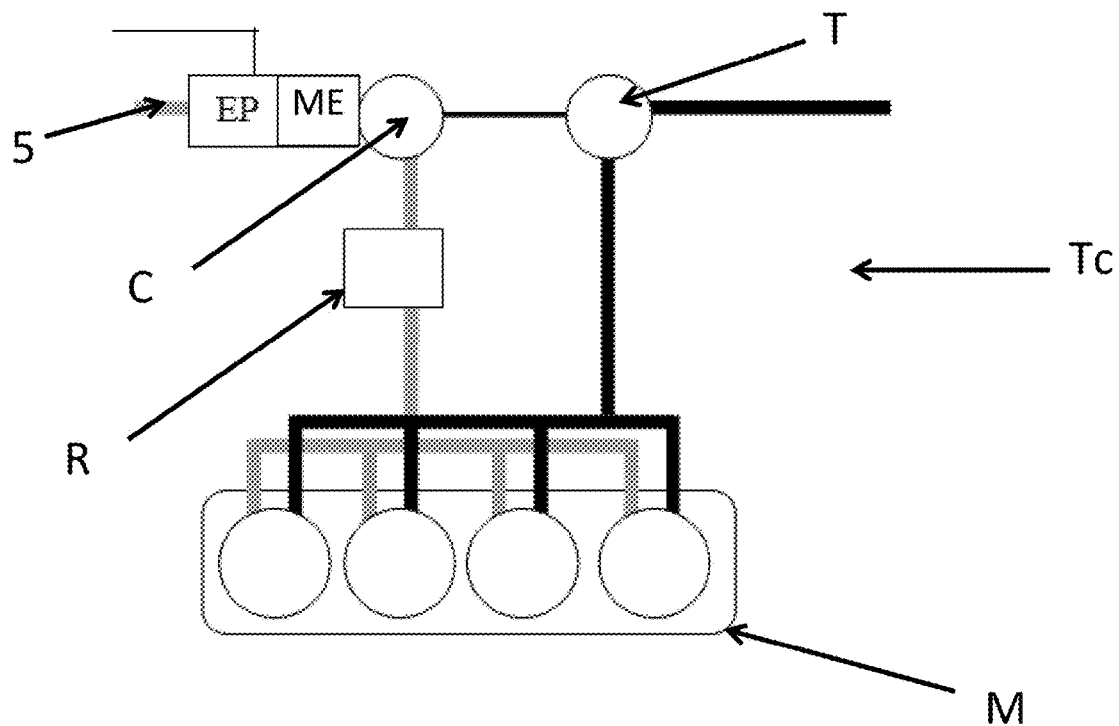
FIG. 5 illustrates a device according to a third configuration of a turbocharger driven by an electric machine.

In the case when the electric machine (ME) is positioned on the compressor (C) side, these power electronics may be incorporated within the electric machine (ME) to form just a single component, as can be seen in FIG. 5. This configuration allows the length of the cables between the two members to be decreased to the shortest possible length.

Figure 6:
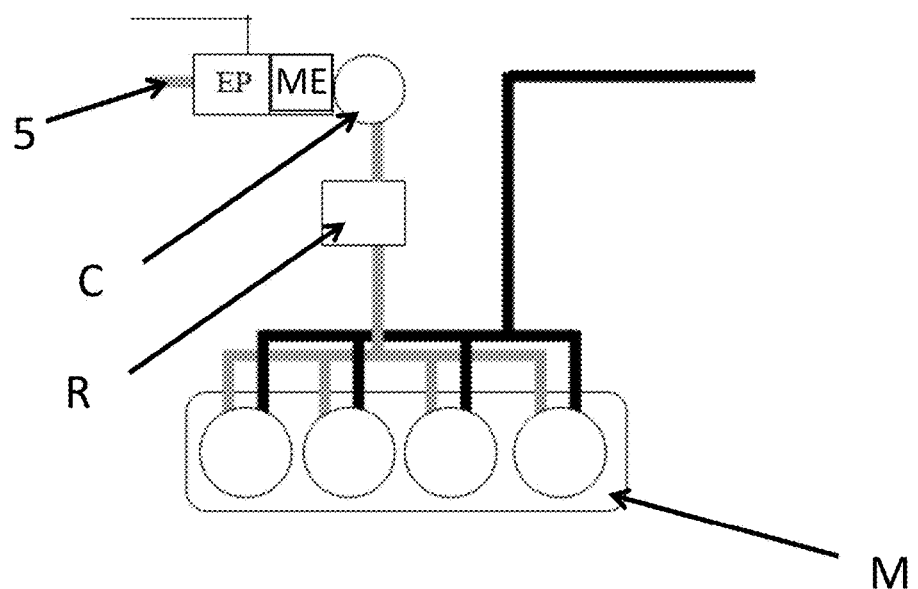
FIG. 6 illustrates an incorporated device in the case of a compressor.

FIG. 6 shows the case of an internal combustion engine (M) with a compressor (C) in which the power electronics are incorporated within the electric machine (ME) to form just one same component. This configuration allows the length of the cables between the two members to be decreased to the shortest possible length.

In all of the cases mentioned, this solution additionally makes it possible to mechanically connect the power electronics (1) to the combustion engine (M) via flexible hoses, allowing filtration and damping of vibrations from the combustion engine.

In the specific case of an electric machine (ME) through which the airflow moves ("air-gap" or "stator-grating" machine), it is even possible to combine the machine and power electronic (1) functions. A saving in terms of space, cooling circuit and overall cost of the system is made.

The invention is not limited to the above described embodiments of the power electronic systems (1) and the cooling device thereof described above only by way of example, and encompasses all variants.

The invention claimed is:

1. A power electronic system comprising:
at least one power electronic component implemented at least partly on at least one circuit board, wherein the at least one circuit board is planar and circular or toroidal in shape and a center of the at least one circuit board comprising a circular opening having an inner edge and a diameter for cooperating with a hose which circulates a cooling flow; and
a heat sink including fins positioned circularly around the inner edge of the circular opening and the fins project from the inner edge of the heat sink towards a center of the hose.

2. The power electronic system according to claim 1, wherein the circuit board is positioned to be orthogonal to the hose for circulating the cooling flow and is aligned with an axis of the hose so that the cooling flow circulates through the circular opening and contacts the at least one circuit board.

3. The power electronic system according to claim 1, wherein the hose for circulating the cooling flow is an air intake for an internal combustion engine.

4. The power electronic system according to claim 1, wherein a diameter of the hose is at least equal to a diameter of the circular opening in the at least one circuit board.

5. The power electronic system according to claim 1, comprising a mechanical housing containing the at least one circuit board.

6. The power electronic system according to claim 5, wherein the mechanical housing is circular or toroidal in shape and comprises a central opening having a diameter that is equal to or larger than the diameter of the circular opening in the at least one circuit board.

7. The power electronic system according to claim 5, wherein the mechanical housing includes fins for absorbing heat inside the mechanical housing and transferring the heat to the cooling flow circulating from the hose.

8. The power electronic system according to claim 5, wherein the mechanical housing incorporates a fan.

9. The power electronic system according to claim 5, wherein the mechanical housing comprises a system for circulating a portion of the cooling flow from the hose inside the mechanical housing.

10. The power electronic system according to claim 1, comprising a heat sink connected thermally to the at least one of circuit board and the at least one power electronic component.

11. The power electronic system according to claim 1, wherein the heat sink is a cylinder having a diameter at least equal to a diameter of the circuit board and the heat sink includes a central opening, having a diameter at least equal to a diameter of the circular opening in the at least one circuit board, and the central opening comprises the inner edge.

12. The power electronic system according to claim 11, wherein the cylinder comprises teeth.

13. The power electronic system according to claim 10, wherein the heat sink is a cylinder having an outer diameter comprising a central opening, having a diameter at least equal to a diameter of the circular opening in the circuit board, and the inner edge.

14. The power electronic system according to claim 1, wherein the at least one power electronic component is positioned at least partly on a cylinder.

15. The power electronic system according to claim 1, wherein the system supplies electrical power to an electrical machine.

16. The power electronic system according to claim 15, wherein the electrical machine drives a compressor.

17. The power electronic system according to claim 15, wherein the electrical machine drives a turbine of a turbocharger.

18. The power electronic system according to claim 15, wherein the electrical machine is positioned upstream of a compressor or upstream of a turbine of a turbocharger.

19. The power electronic system according to claim 15, comprising the electrical machine is mounted on a shaft connected to a compressor of a turbine of a turbocharger.

20. A device for cooling a power electronic system according to claim 1, wherein the heat sink is aligned with an axis of the hose which circulates the cooling flow.

* * * * *